US009007056B2

(12) United States Patent
Okamoto et al.

(10) Patent No.: US 9,007,056 B2
(45) Date of Patent: Apr. 14, 2015

(54) MONITORING DEVICE AND MONITORING METHOD FOR ROTARY ENCODER

(71) Applicant: OMRON Corporation, Kyoto (JP)

(72) Inventors: Kazunori Okamoto, Kusatsu (JP); Teruyuki Nakayama, Kyoto (JP); Minoru Hashimoto, Ritto (JP); Daichi Kamisono, Ritto (JP)

(73) Assignee: OMRON Corporation, Kyoto-shi (JP)

( * ) Notice: Subject to any disclaimer, the term of this patent is extended or adjusted under 35 U.S.C. 154(b) by 0 days.

(21) Appl. No.: 13/777,041

(22) Filed: Feb. 26, 2013

(65) Prior Publication Data

US 2013/0241570 A1    Sep. 19, 2013

(30) Foreign Application Priority Data

Mar. 14, 2012 (JP) ................. 2012-056794

(51) Int. Cl.
  *G01B 7/30* (2006.01)
  *G01R 31/28* (2006.01)
  *G01D 5/245* (2006.01)
  *G01D 5/347* (2006.01)

(52) U.S. Cl.
  CPC .......... *G01R 31/2841* (2013.01); *G01D 5/2451* (2013.01); *G01D 5/3473* (2013.01)

(58) Field of Classification Search
  CPC .............. G01P 3/44; B62D 6/10; G01L 3/109
  USPC .................. 324/76.77, 76.82, 85, 86, 90, 91, 324/207.12, 207.25; 341/115
  See application file for complete search history.

(56) References Cited

U.S. PATENT DOCUMENTS

| 2007/0152856 A1* | 7/2007 | Yamamoto | 341/115 |
| 2010/0201373 A1* | 8/2010 | Sato et al. | 324/537 |
| 2012/0086440 A1* | 4/2012 | Shibata et al. | 324/207.25 |

FOREIGN PATENT DOCUMENTS

| JP | 2009-156840 A | 7/2009 |
| JP | 2010-203903 A | 9/2010 |

OTHER PUBLICATIONS

EP search report issued on Jan. 23, 2014.
EP search report opinion issued on Jan. 23, 2014.

* cited by examiner

*Primary Examiner* — Patrick Assouad
*Assistant Examiner* — Sean M. Curtis
(74) *Attorney, Agent, or Firm* — Marvin A. Motsenbocker; Mots Law, PLLC

(57) ABSTRACT

Disclosed is a monitoring device for a rotary encoder electronically connectable to the monitoring device. A pulse generating unit generates a comparison pulse signal by extracting a portion corresponding to a specific phase range from a first pulse included in a first pulse signal output from the rotary encoder. The rotary encoder detects rotation of a rotating body and outputs the first pulse signal and a second pulse signal, the first pulse signal and the second pulse signal having a phase difference from each other. A determining unit determines an abnormality of the rotary encoder, based on a state of a pulse of the comparison pulse signal at a specific timing of a second pulse included in the second pulse signal.

4 Claims, 9 Drawing Sheets

MONITORING DEVICE AND MONITORING METHOD FOR ROTARY ENCODER

CROSS REFERENCE TO RELATED APPLICATIONS

This application claims priority based on 35USC119 from prior Japanese Patent Application No. P2012-056794 filed on Mar. 14, 2012, entitled "MONITORING DEVICE AND MONITORING METHOD FOR ROTARY ENCODER", the entire contents of which are incorporated herein by reference.

TECHNICAL FIELD

The invention relates to a monitoring device and a monitoring method for a rotary encoder, and more particularly to a technology that detects an abnormality of a pulse signal output from a rotary encoder.

RELATED ART

When motion control applications of a machine tool, an industrial robot, or the like are constructed using a servo system, a servo motor is used as a driving source of machinery. In such case, usually a rotary encoder is used as a sensor for monitoring operation (a speed, a position, a direction, etc.) of the motor.

Typical rotary encoders are broadly categorized into a TTL (Transistor Transistor Logic) type, which outputs a digital signal (pulse signal), and a sin/cos type, which outputs an analog signal. Both of the types output signals of two phases having a phase difference of 90° from each other.

When the output signals of the rotary encoder are abnormal, the abnormality influences motor control. Therefore, so far a variety of methods of detecting abnormalities of output signals of a rotary encoder have been proposed.

For example, for the sin/cos rotary encoder, a method of checking establishment of the relation of "$\sin^2+\cos^2=1$" between voltage values of two output signals is known. When the above-mentioned relation is not found, an output signal abnormality is detected. However, because the TTL rotary encoder outputs digital signals, the above-described detecting method cannot be used for the TTL rotary encoder. Therefore, there is a need for a different detecting method to detect abnormalities of TTL rotary encoder output signals.

For example, the abnormality monitoring device disclosed in Japanese Unexamined Patent Publication No. 2010-203903 (Patent Document 1) detects abnormalities of an encoder or a wiring system when voltage levels of analog signals output from the rotary encoder are within a predetermined range. The abnormality monitoring device detects the abnormalities of an encoder or the like when a difference in the number of pulses between digital signals corresponding to analog signals which are input of two phases is equal to or greater than a predetermined threshold. The abnormality monitoring device detects the abnormalities of an encoder or the like when the pulse width of a composite signal of the digital signals of two phases differs from the pulse width of the signal in a past control period.

The abnormality monitoring device disclosed in Japanese Unexamined Patent Publication No. 2010-203903 performs three kinds of detecting methods. For this reason, the configuration of an abnormality monitoring device is complicated and problematic. In order to simplify the configuration of an abnormality monitoring device, the following method may be considered: a TTL rotary encoder to be examined and a rotary encoder for comparison are prepared; and output signals of the prepared encoders are compared by a monitoring device. However, because this method requires preparation of two rotary encoders, the method is thought to increase the cost or labor for detection.

SUMMARY

An embodiment is directed to a monitoring device for a rotary encoder that detects rotation of a rotating body and outputs a first pulse signal and a second pulse signal having a phase difference from each other. The monitoring device includes a pulse generating unit that generates a comparison pulse signal by extracting a portion corresponding to a specific phase range from a first pulse included in the first pulse signal, and an abnormality determining unit that determines an abnormality of the rotary encoder, based on a state of a pulse of the comparison pulse signal at a specific timing of a second pulse included in the second pulse signal.

Preferably, the determining unit determines that the rotary encoder is abnormal when a state of a pulse of the comparison pulse signal differs from a predetermined state at a time wherein at least one of a rise and a fall of the second pulse occurs.

Preferably, the pulse generating unit includes a frequency multiplying unit that generates a third pulse signal having a frequency which is (2n+1) (n is an integer equal to or greater than 1) times a frequency of the first pulse signal and an exclusive OR logic generating unit, which generates the comparison pulse signal by generating an exclusive OR logic of the third pulse signal and the first pulse signal.

Preferably, the determining unit includes a first D flip-flop that receives the comparison pulse signal as input data and the second pulse signal as a clock, an inverter that inverts the second pulse signal, a second D flip-flop that receives the comparison pulse signal as input data and an output signal of the inverter as a clock, and a detecting unit that detects an abnormality of the rotary encoder when a combination of a state of an output signal of the first D flip-flop and a state of an output signal of the second D flip-flop differs from a predetermined combination.

Preferably, n in the formula above is 1.

Another embodiment is a method for a rotary encoder that detects rotation of a rotating body and outputs a first pulse signal and a second pulse signal having a phase difference from each other. The monitoring method includes generating a comparison pulse signal by extracting a portion corresponding to a specific phase range from a first pulse included in the first pulse signal, and determining an abnormality of the rotary encoder, based on a state of a pulse of the comparison pulse signal at a specific timing of a second pulse included in the second pulse signal.

Preferably, a rotary encoder is deemed abnormal when a state of the pulse of the comparison pulse signal differs from a predetermined state at a timing wherein at least one of a rise and a fall of the second pulse occurs.

Preferably, generation of the comparison pulse signal includes generating a third pulse signal having a frequency that is (2n+1) (n is an integer equal to or greater than 1) times a frequency of the first pulse signal and generating a comparison pulse signal by generating an exclusive OR logic of the third pulse signal and the first pulse signal.

According to embodiments above, abnormalities of an encoder can be detected from only the output signals of one TTL rotary encoder.

DETAILED DESCRIPTION

Hereinafter, embodiments are described in detail with reference to drawings. Like portions or corresponding portions among the drawings are denoted by the same reference signs and further description is not repeated.

Figure 1:
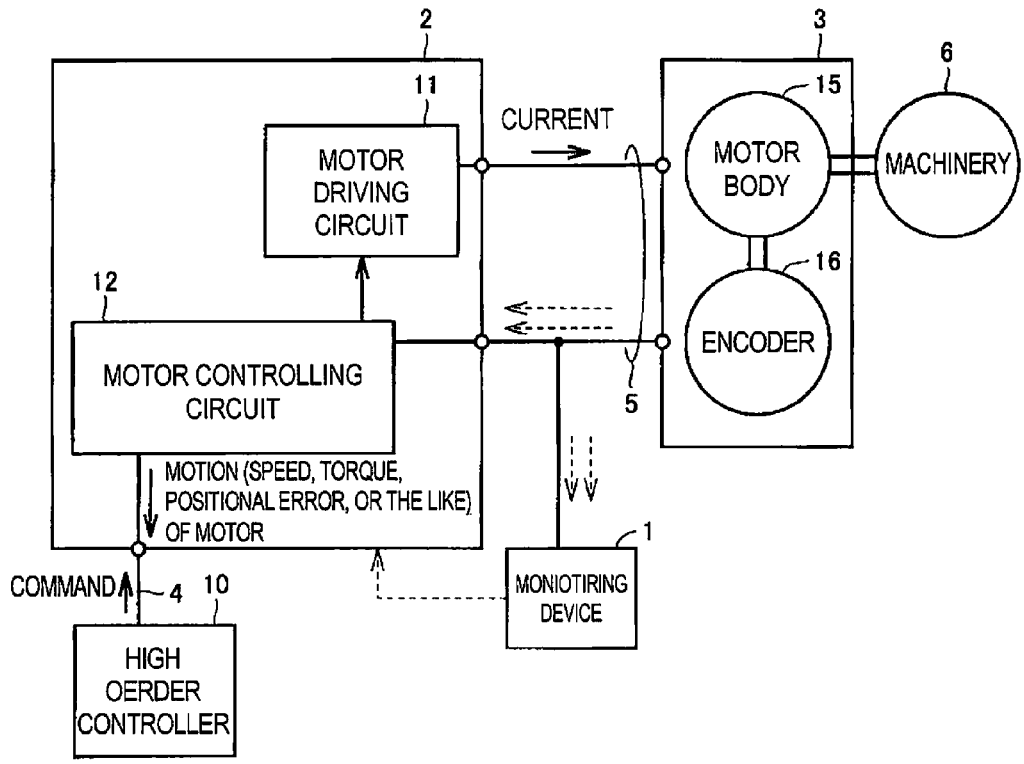
FIG. 1 is a diagram illustrating an application example of a monitoring device for a rotary encoder according to an embodiment.

FIG. 1 exemplifies a monitoring device for a rotary encoder according to an embodiment. With reference to FIG. 1, a motion control application includes monitoring device 1, servo driver 2, servo motor 3, machinery 6, and higher order controller 10. The kind of machinery 6 is not limited in particular. Servo motor 3 is a driving source of the machinery 6.

Servo motor 3 includes motor body 15 and rotary encoder (hereinafter, simply called an "encoder") 16. Encoder 16 is a TTL rotary encoder. Encoder 16 detects a rotational displacement amount of motor body 15, which is a rotating body, and outputs digital signals (pulse signals) of 2 phases that have a phase difference from each other. Generally the phase difference between the digital signals of 2 phases is 90°. That is, in this embodiment, a normal phase difference is 90°.

With reference to FIG. 1, servo motor 3 servo motor 3 includes motor body 15 and encoder 16. However, motor body 15 and encoder 16 may be separately provided.

Monitoring device 1 detects an abnormality of an output signal of encoder 16, based on pulse signals output from encoder 16. The abnormality of the output signal of encoder 16 means an abnormality of encoder 16. The detection result of monitoring device 1 is fed back, for example, to servo driver 2. When the abnormality of the output signal of encoder 16 is detected by monitoring device 1, servo driver 2 causes servo motor 3 servo motor 3 to stop operating, for example.

Servo driver 2 includes a motor driving circuit 11 and a motor controlling circuit 12. Motor controlling circuit 12 receives commands from higher order controller 10 via communication cable 4. Motor controlling circuit 12 controls motor driving circuit 11, based on a signal output from encoder 16 such that motion of motor body 15 according to these commands is performed. Motor driving circuit 11 drives motor body 15 by supplying current to motor body 15. Servo driver 2 and servo motor 3 servo motor 3 are connected to each other via cable 5.

Motor controlling circuit 12 transmits data related to motion (a speed, command torque, and a position error) of servo motor 3 servo motor 3 to higher order controller 10 via communication cable 4. Higher order controller 10 is realized as a PLC (Programmable Logic Controller), for example.

According to the configuration illustrated in FIG. 1, monitoring device 1 is a discrete device, which is provided independently of the other devices. However, the configuration of the monitoring device according to an embodiment may not be necessarily limited to the above-described configuration. For example, monitoring device 1 may be mounted in servo driver 2. That is, servo driver 2 may have a function of detecting the abnormality of the output signals of encoder 16. Alternatively, monitoring device 1 may be mounted in servo motor 3.

Figure 2:
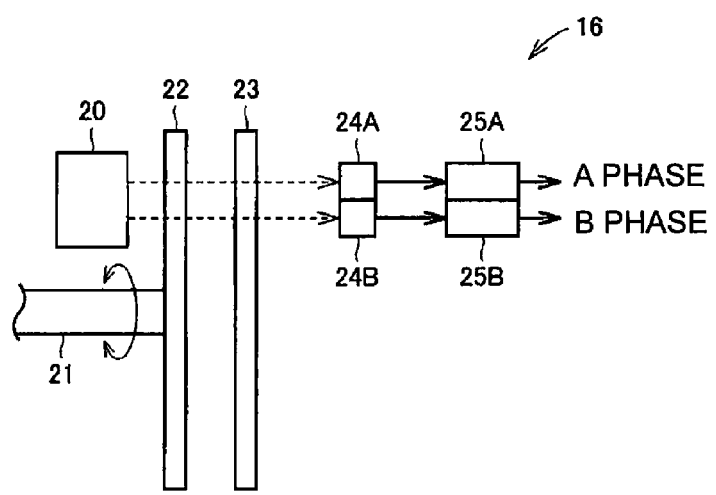
FIG. 2 is a diagram schematically illustrating a configuration of an encoder 16 illustrated in FIG. 1.

FIG. 2 is a diagram schematically illustrating a configuration of encoder 16 illustrated in FIG. 1. With reference to FIG. 2, encoder 16 includes light projecting element 20, rotational slit plate 22 attached to a rotating shaft 21, fixed slit plate 23, light receiving elements 24A and 24B, and waveform shaping circuits 25A and 25B. Light projecting element 20 is formed of a light emitting diode (LED), for example. Each of the light receiving elements 24A and 24B is formed of a photo diode (PD), for example.

Rotating shaft 21 is combined with a rotating shaft of motor body 15 (see FIG. 1). Rotating shaft 21 rotates along with rotation of motor body 15. Rotating shaft 21 is assumed to be able to rotate in any direction, a clockwise direction (CW) and a counterclockwise direction (CCW). Rotational slit plate 22 rotates along with rotation of rotating shaft 21. Thereby, light emitted from light projecting element 20 is transmitted or intercepted. Fixed slit plate 23 has two slits that are provided separately from each other and are shifted in phase from each other by 90°. Light receiving elements 24A and 24B receive the light that has passed through rotational slit plate 22 and fixed slit plate 23, and output electrical signals, respectively. Therefore, the output signals of light receiving elements 24A and 24B have a phase difference of 90° from each other.

The output signals of light receiving elements 24A and 24B have the waveform of an approximate sinusoidal wave. Waveform shaping circuits 25A and 25B shape the waveform of pulses of the output signals of light receiving elements 24A and 24B. Thereby, pulse signals having a phase difference of 90° from each other are output from waveform shaping circuits 25A and 25B. Hereinafter, the two pulse signals are called an A phase signal and a B phase signal, respectively. In FIG. 2, although the signal that is output from waveform shaping circuit 25A is the A phase signal and the signal that is output from waveform shaping circuit 25B is the B phase signal, which signal among the output signals of waveform shaping circuits 25A and 25B is treated as the A phase signal or the B phase signal is not particularly limited.

In addition, in embodiments, a "first pulse signal" and a "second pulse signal" are the A phase signal and B phase signal, respectively, or vice versa. That is, when "the first pulse signal" is the A phase signal, "the second pulse signal" is the B phase signal. Conversely, when "the first pulse signal" is the B phase signal, "the second pulse signal" is the A phase signal.

Figure 3A:
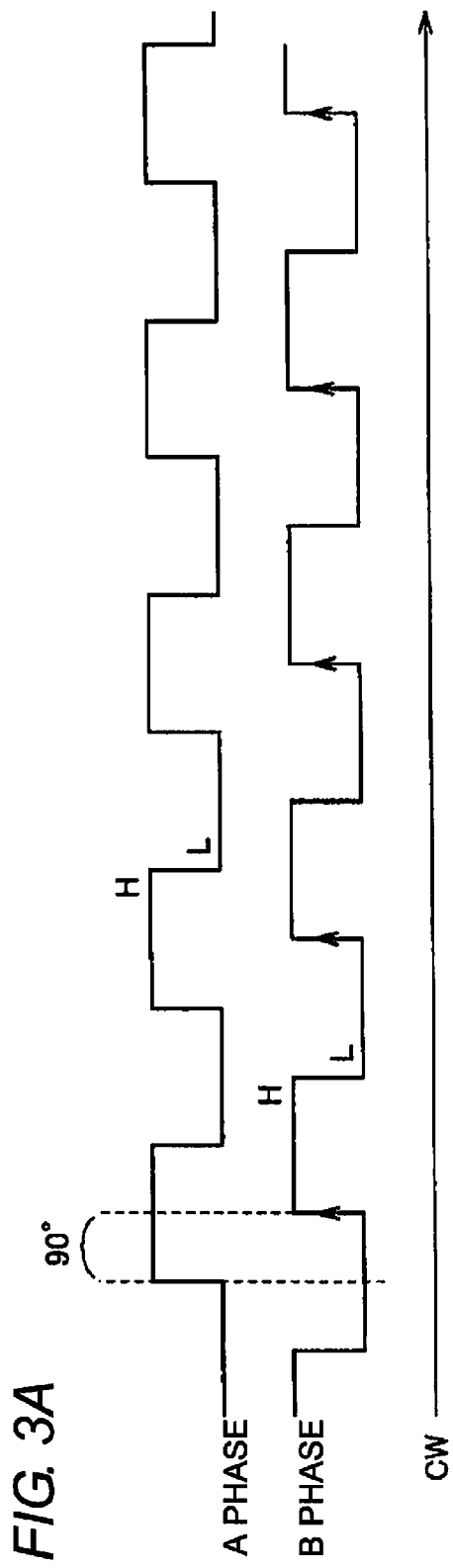
FIG. 3 is a waveform chart of an A phase signal and a B phase signal output from encoder 16 illustrated in FIG. 1.
Figure 3B:
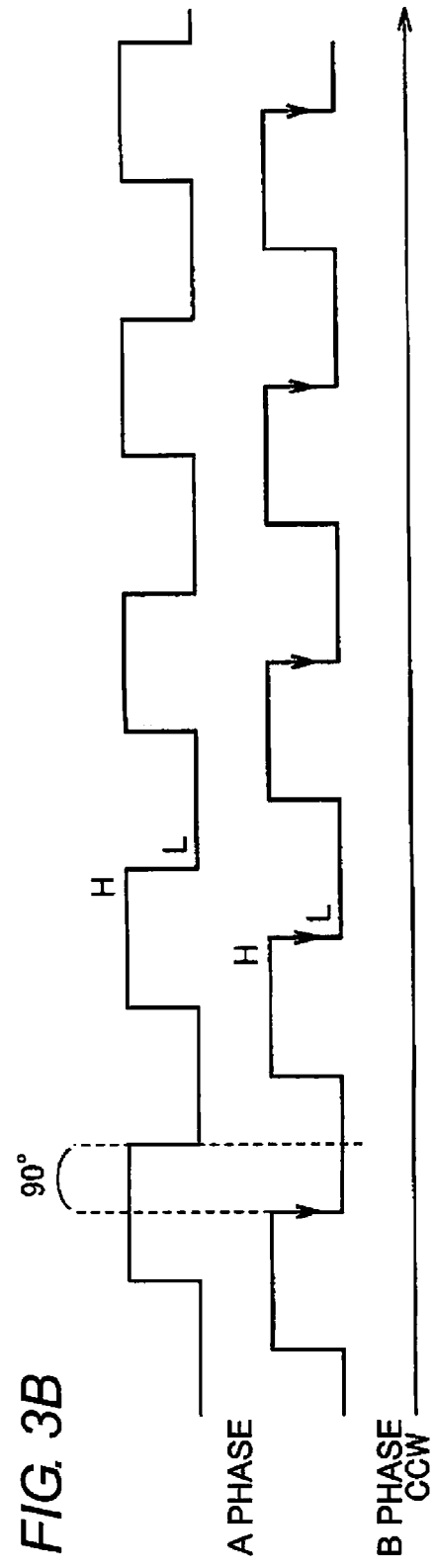

FIG. 3 is a waveform chart of the A phase signal and the B phase signal that are output from encoder 16 illustrated in FIG. 1. FIG. 3A is a waveform chart of the A phase signal and the B phase signal when the direction of rotation of the rotating shaft is a clockwise direction (CW). FIG. 3B is a waveform chart of the A phase signal and the B phase signal when the direction of rotation of the rotating shaft is a counterclockwise direction (CCW).

With reference to FIGS. 3A and 3B, the phase difference between the A phase signal and the B phase signal is 90° regardless of the direction of rotation, the clockwise direction or the counterclockwise direction, of rotating shaft 21 rotating shaft 21 (see FIG. 2).

When the direction of rotation is the clockwise direction, the B phase signal rises while the A phase signal is in a state of "H (high)" level. On the other hand, when the direction of rotation is counterclockwise, the B phase signal falls while the A phase signal is in a state of the "H" level. Therefore, the direction of rotation can be detected by determining whether the rise has occurred or the fall has occurred in the B phase signal while the A phase signal is at the "H" level.

Moreover, the frequencies of the A phase signal and the B phase signal are proportional to rotation speed of the rotating shaft. Therefore, the rotation speed can be detected by counting the number of pulses for a predetermined period of time.

The reason is as follows: when encoder 16 is normal, as illustrated in FIG. 3, the phase difference between the A phase signal and the B phase signal is 90°. However, when encoder 16 is in abnormal, the phase difference between the A phase signal and the B phase signal deviates from 90°.

Figure 4:
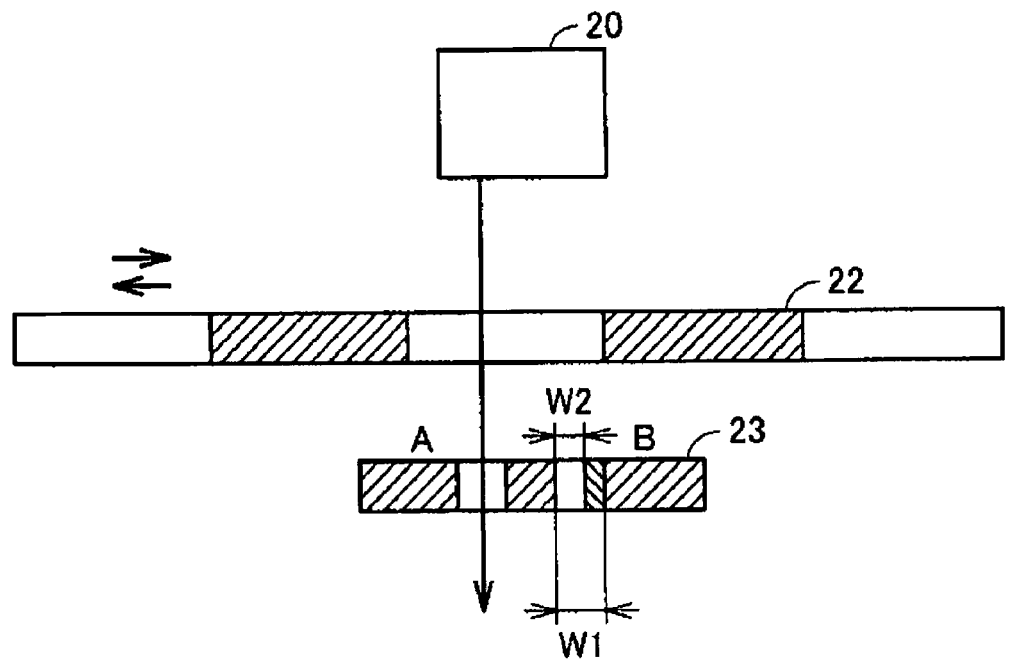
FIG. 4 is a diagram for describing a deviation of a phase difference between the A phase signal and the B phase signal.

FIG. 4 is a diagram for describing deviation of the phase difference between the A phase signal and the B phase signal. With reference to FIG. 4, fixed slit plate 23 is provided with a slit for generating the A phase signal and a slit for generating the B phase signal. The width of the slit for generating the B phase signal is W1 at the time of being normal. For example, the width of the slit is reduced to W2 due to failure such as contamination of the slit. In this case, the phase difference between the A phase signal and the B phase signal is likely to deviate from 90°.

Figure 5:
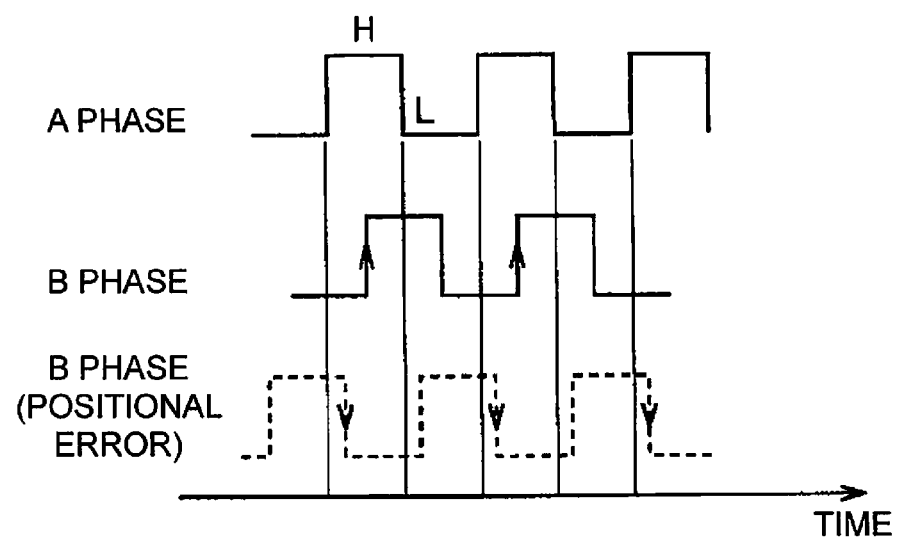
FIG. 5 is a waveform chart for describing a problem arising when the phase difference between the A phase signal and the B phase signal greatly deviates from 90°.

FIG. 5 is a waveform chart for describing a problem arising when the phase difference between the A phase signal and the B phase signal greatly deviates from 90°. With reference to FIG. 5, when the phase difference between the A phase signal and the B phase signal is 90°, the B phase signal rises during a period in which the A phase signal is at the "H" level. Therefore, the clockwise rotation is detected. When the phase difference between the A phase signal and the B phase signal exceeds 90°±90°, the B phase signal falls during a period in which the A phase signal is at the "H" level. Therefore, counterclockwise rotation is detected. However, in this case, the direction of rotation is actually clockwise. That is, when the phase difference between the A phase signal and the B phase signal exceeds 90°±90°, an erroneous detection on the direction of rotation is made.

According to an embodiment, monitoring device 1 can detect the abnormality of the output signal of the TTL rotary encoder, especially the abnormality of the phase difference between the A phase signal and the B phase signal. Hereinafter, each embodiment is described in detail.

First Embodiment

Figure 6:
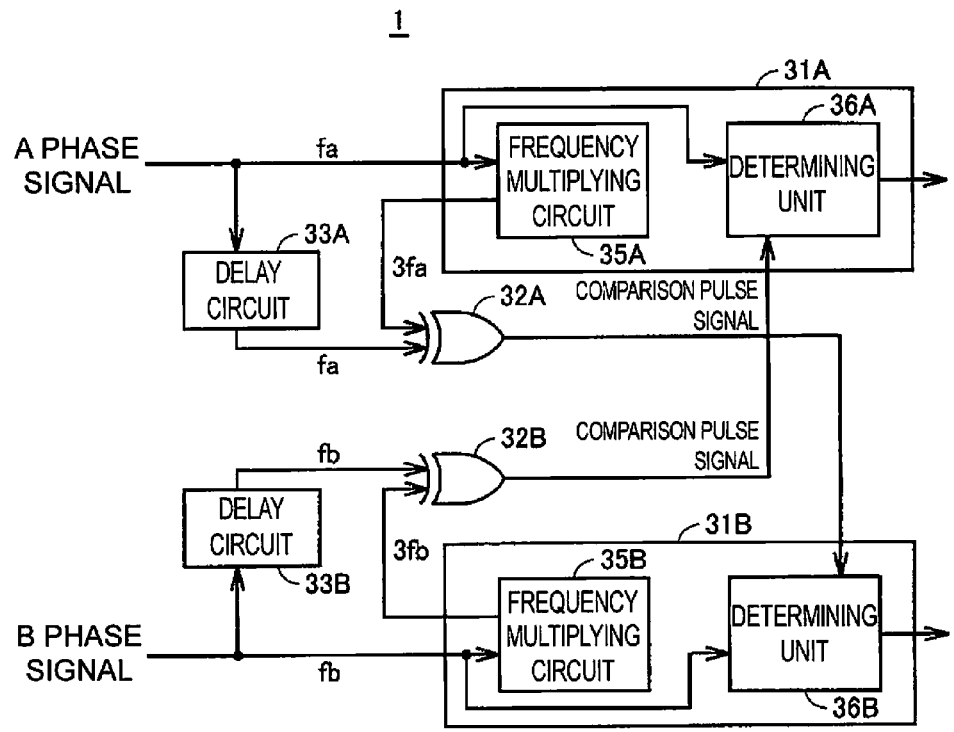
FIG. 6 is a configuration view of a monitoring device according to a first embodiment.

FIG. 6 is a configuration view of a monitoring device according to a first embodiment. With reference to FIG. 6, monitoring device 1 includes CPUs (Central Processing Units) 31A and 31B, XOR (exclusive OR) circuits 32A and 32B, and delay circuits 33A and 33B. CPU 31A includes frequency multiplying circuit 35A and determining unit 36A. CPU 31B includes frequency multiplying circuit 35B and determining unit 36B.

Frequency multiplying circuit 35A receives the A phase signal and generates a pulse signal having a frequency (3 fa), which is 3 times the frequency fa of the A phase signal. XOR circuit 32A generates an exclusive OR logic of the A phase signal and the pulse signal having the frequency 3 fa. Delay circuit 33A delays the A phase signal so that a time delay of operation which occurs when frequency multiplying circuit 35A generates the pulse signal having the frequency 3 fa may be compensated for.

XOR circuit 32A outputs a comparison pulse signal to be compared with the B phase signal. The comparison pulse signal is input to determining unit 36B.

Similarly, frequency multiplying circuit 35B receives the B phase signal and generates a pulse signal having a frequency (3 fb) that is 3 times the frequency fb of the B phase signal. Moreover, the relation "fb=fa" is established. XOR circuit 32B generates an exclusive OR logic of the B phase signal and the pulse signal having the frequency 3 fb. Delay circuit 33B delays the B phase signal so that a time delay of operation, which occurs when frequency multiplying circuit 35B generates the pulse signal having the frequency 3 fb may be compensated for.

The output signal of XOR circuit 32B serves as a comparison pulse signal to compare with the A phase signal. This comparison pulse signal is input to determining unit 36A.

Determining unit 36A determines whether the phase difference between the A phase signal and the B phase signal is within a range of 90°±30° by comparing the A phase signal and the comparison pulse signal. When the phase difference is outside the range of 90°±30°, determining unit 36A determines that the A phase signal and the B phase signal are abnormal and outputs a signal that indicates the abnormalities.

Determining unit 36B determines whether the phase difference between the A phase signal and the B phase signal is within the range of 90°±30° by comparing the B phase signal and the comparison pulse signal. When the phase difference is outside the range of 90°±30°, determining unit 36B determines that the A phase signal and the B phase signal are abnormal and outputs a signal that indicates the abnormalities.

As illustrated in FIG. 6, in monitoring device 1, the configuration for detecting the abnormalities of the A phase signal and the B phase signal adopts a dual system. Thereby, the abnormalities of the output signals of the rotary encoder can be detected more surely. According to this embodiment, a "pulse generating unit" included in the monitoring device of an embodiment is realized by a combination of frequency multiplying circuit 35A and XOR circuit 32A, or a combination of frequency multiplying circuit 35B and XOR circuit 32B. In addition, the "determining unit" included in the monitoring device is realized by determining unit 36A or determining unit 36B.

In FIG. 6, the delay circuit and the XOR circuit are illustrated as circuits provided separately from the CPU. However, the CPU may have the function of the delay circuit and/or the XOR circuit therein. Determining units 36A and 36B are not limited to the configuration which outputs a signal at the time of occurrence of the abnormalities, but may adopt a configuration which outputs a signal that indicates whether the A phase signal and the B phase signal are normal or abnormal.

Figure 7:
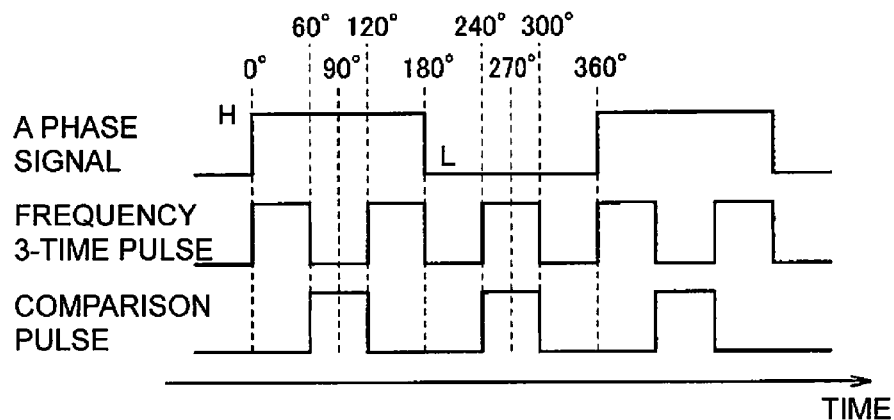
FIG. 7 is a diagram for describing a comparison pulse signal generated by a frequency multiplying circuit 35A and an XOR circuit 32A that are illustrated in FIG. 6.

FIG. 7 is a diagram for describing the comparison pulse signal generated by frequency multiplying circuit 35A and XOR circuit 32A, which are illustrated in FIG. 6. With reference to FIG. 7, a portion corresponding to a specific phase range is extracted from an input signal. This is carried out by an exclusive OR operation of an input signal (A phase signal) and a signal having a frequency of 3 times the input signal frequency. According to this embodiment, a portion corresponding to the phase range of 90°±30° (a phase range of 60° to 120°) is extracted from a pulse included in the A phase signal. The extracted pulse serves as the comparison pulse signal.

Figure 8:
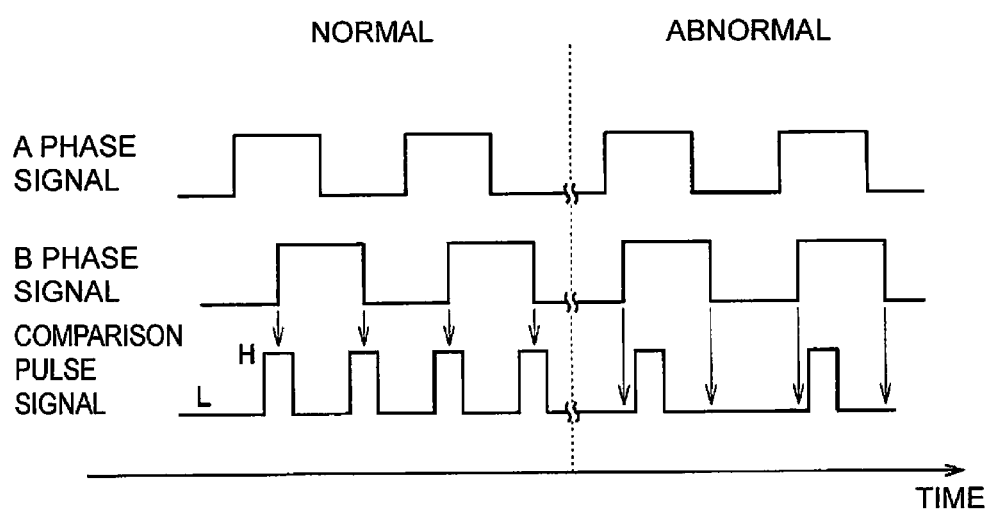
FIG. 8 is a waveform chart for describing an abnormality determining method according to the first embodiment.

FIG. 8 is a waveform chart for describing an abnormality determining method according to the first embodiment. With reference to FIGS. 6 and 8, determining unit 36B checks the state of the comparison pulse signal at a specific timing of the B phase signal. According to this embodiment, determining unit 36B checks the state of the comparison pulse signal at timing of a rise or a fall of the B phase signal. The comparison pulse signal illustrated in FIG. 8 is the same as the comparison pulse signal illustrated in FIG. 7.

For example, when the direction of rotation is the clockwise direction, the state of the comparison pulse signal at the time of the rise of the B phase signal is checked. When the direction of rotation is the counterclockwise direction, the state of the comparison pulse signal at the time of the fall of the B phase signal is checked. When the state of the comparison pulse signal is the "H" level at the time of the rise or fall of the B phase signal, determining unit 36B determines that the A phase signal and the B phase signal are normal. The situation that the A phase signal and the B phase signal are normal means that the phase difference between the A phase signal and the B phase signal falls within the range of 90°±30°.

On the other hand, when the state of the comparison pulse signal is a "L (low)" level at the time of the rise or fall of the B phase signal, determining unit 36B determines that the A phase signal and the B phase signal are abnormal. In this case, the phase difference between the A phase signal and the B phase signal is outside the range of 90°±30°.

The determining method performed by determining unit 36A is the same as the above-described method, and the method checks the state of the comparison pulse signal at timing of the rise or fall of the A phase signal. The comparison pulse signal used for the determination made by determining unit 36A is generated by the exclusive OR operation of the B phase signal and the signal having a frequency that is 3 times the frequency of the B phase signal.

Figure 9:
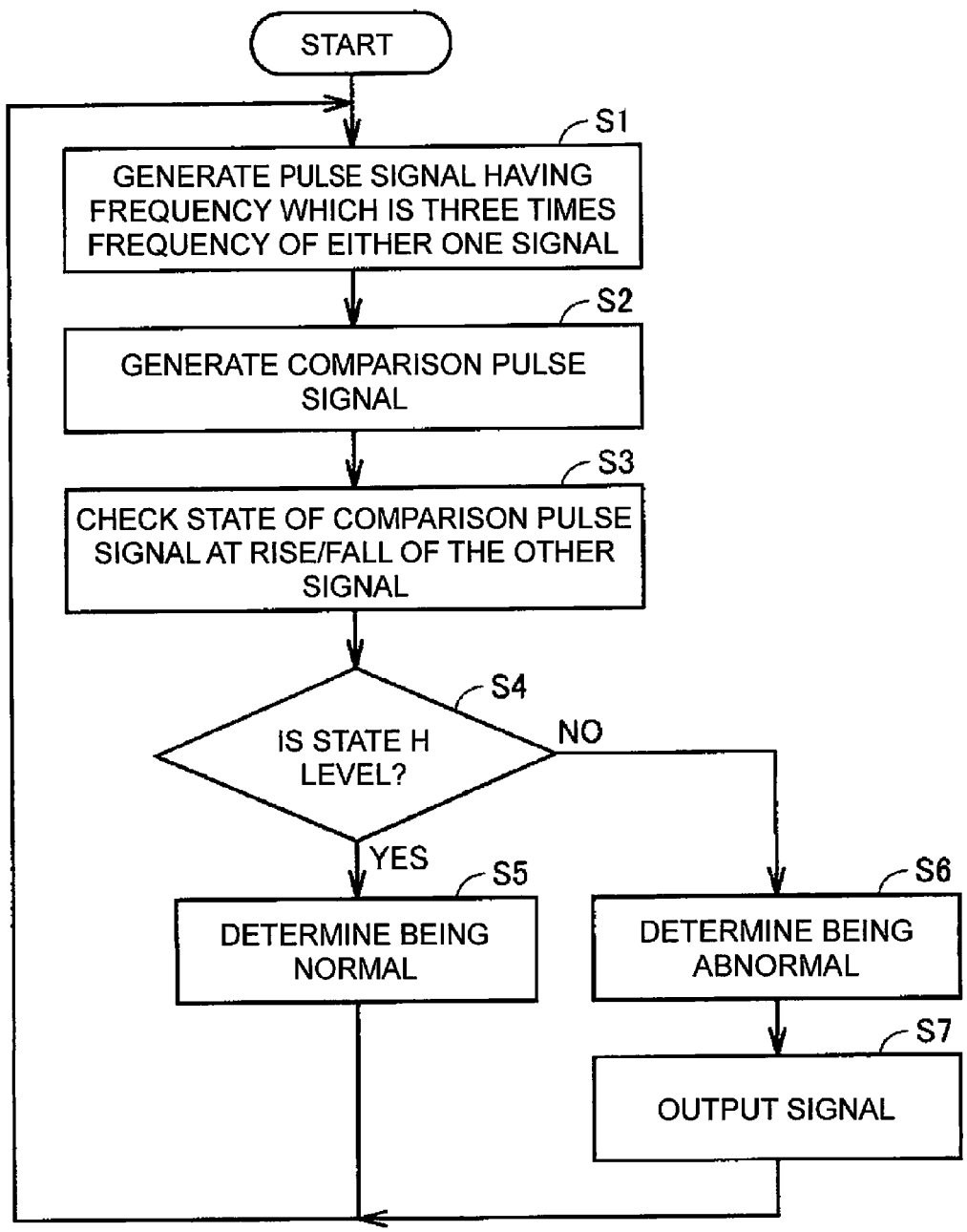
FIG. 9 is a flowchart describing the flow of processing of an abnormality detecting method according to the first embodiment.

FIG. 9 is a flowchart describing the flow of processing of an abnormality detecting method according to the first embodiment. Hereinafter, an abnormality determining method based on comparison between the B phase signal and the comparison pulse signal will be described as a representative example. An abnormality determining method based on comparison between the A phase signal and the comparison pulse signal is achieved by replacing frequency multiplying circuit 35A, XOR circuit 32A, and determining unit 36B with frequency multiplying circuit 35B, XOR circuit 32B, and determining unit 36A, respectively in the following description.

With reference to FIG. 9, in Step S1, frequency multiplying circuit 35A generates a pulse signal having a frequency which is 3 times the frequency of either one (for example, the A phase signal) of the A phase signal and the B phase signal. In Step S2, XOR circuit 32A generates the comparison pulse signal by performing the exclusive OR operation of the pulse signal and the original pulse signal (A phase signal). In Step S3, determining unit 36B checks the state of the comparison pulse signal at the rise or fall of the other phase signal (for example, the B phase signal). In this case, determining unit 36B checks the state of the comparison pulse signal at both the rise and fall of the B phase signal, for example. Alternatively, determining unit 36B may check the state of the comparison pulse signal at only either one of the rise and fall of the B phase signal.

When the comparison pulse signal is at the H level at both the rise and fall of the B phase signal (YES in Step S4), determining unit 36B determines that the phase difference between the A phase signal and the B phase signal is normal in Step S5. On the other hand, when the comparison pulse signal is at the L level at least one of the rise and fall of the B phase signal (NO in Step S4), determining unit 36B determines that the phase difference between the A phase signal and the B phase signal is abnormal in Step S6. In Step S7, determining unit 36B outputs the signal indicating the abnormality detected.

When Step S5 or S7 ends, the processing ranging from Step S1 is repeated.

According to the first embodiment, abnormalities of the rotary encoder can be detected only with the output signals of the rotary encoder. Therefore, another rotary encoder is not required. Accordingly, a system for detecting the abnormalities of a rotary encoder can be realized at low cost.

According to the first embodiment, the abnormalities of a rotary encoder are accurately detectable. Thereby, the system illustrated in FIG. 1 can be built as a safe system.

Second Embodiment

Figure 10:
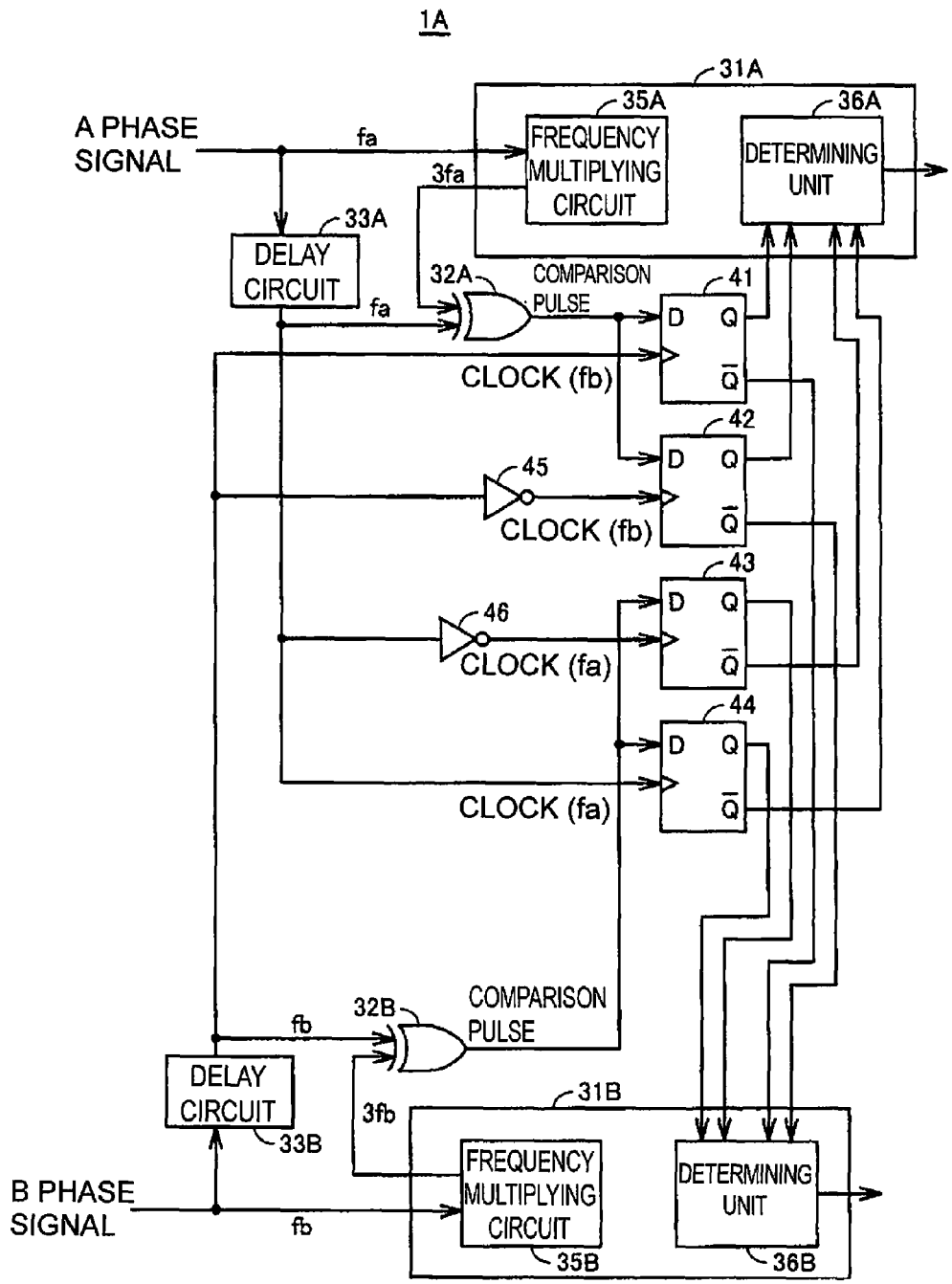
FIG. 10 is a configuration view of a monitoring device according to a second embodiment.

FIG. 10 is a configuration view of a monitoring device according to a second embodiment. With reference to FIGS. 6 and 10, a monitoring device 1A differs from monitoring device 1 in that it is further provided with D flip-flops 41 to 44 and inverters 45 and 46. In addition, monitoring device 1A also differs from monitoring device 1 in that an A phase signal is not input to a determining unit 36A and a B phase signal is not input to a determining unit 36B.

D flip-flop 41 receives, as input data (indicated as "D" in the drawing), the output signal, i.e., the comparison pulse signal, of XOR circuit 32A, and receives, as a clock, the B phase signal delayed by delay circuit 33B. An output signal Q of D flip-flop 41 is input to determining unit 36A, and an output signal /Q ("/" indicates "inverted", which is also the same hereinafter) of D flip-flop 41 is input to determining unit 36B.

D flip-flop 42 differs from D flip-flop 41 in that an inverted signal of the B phase signal, which is output from inverter 45, is received as a clock.

D flip-flop 43 receives, as input data (indicated as "D" in the drawing), the output signal, i.e., the comparison pulse signal, of XOR circuit 32B, and receives, as a clock, an inverted signal of the A phase signal, which is output from inverter 46. Therefore, an output signal Q of D flip-flop 43 is input to determining unit 36B, and an output signal /Q of D flip-flop 43 is input to determining unit 36A.

D flip-flop 44 differs from D flip-flop 43 in that it receives the A phase signal that is delayed by delay circuit 33A as a clock.

According to this embodiment, the "determining unit" included in the monitoring device of the present invention is formed of determining unit 36A and D flip-flops 41 and 42, or of determining unit 36B and D flip-flops 43 and 44. Therefore, according to this embodiment, determining unit 36A or determining unit 36B serves as a "detecting unit" included in the monitoring device of this embodiment.

Figure 11:
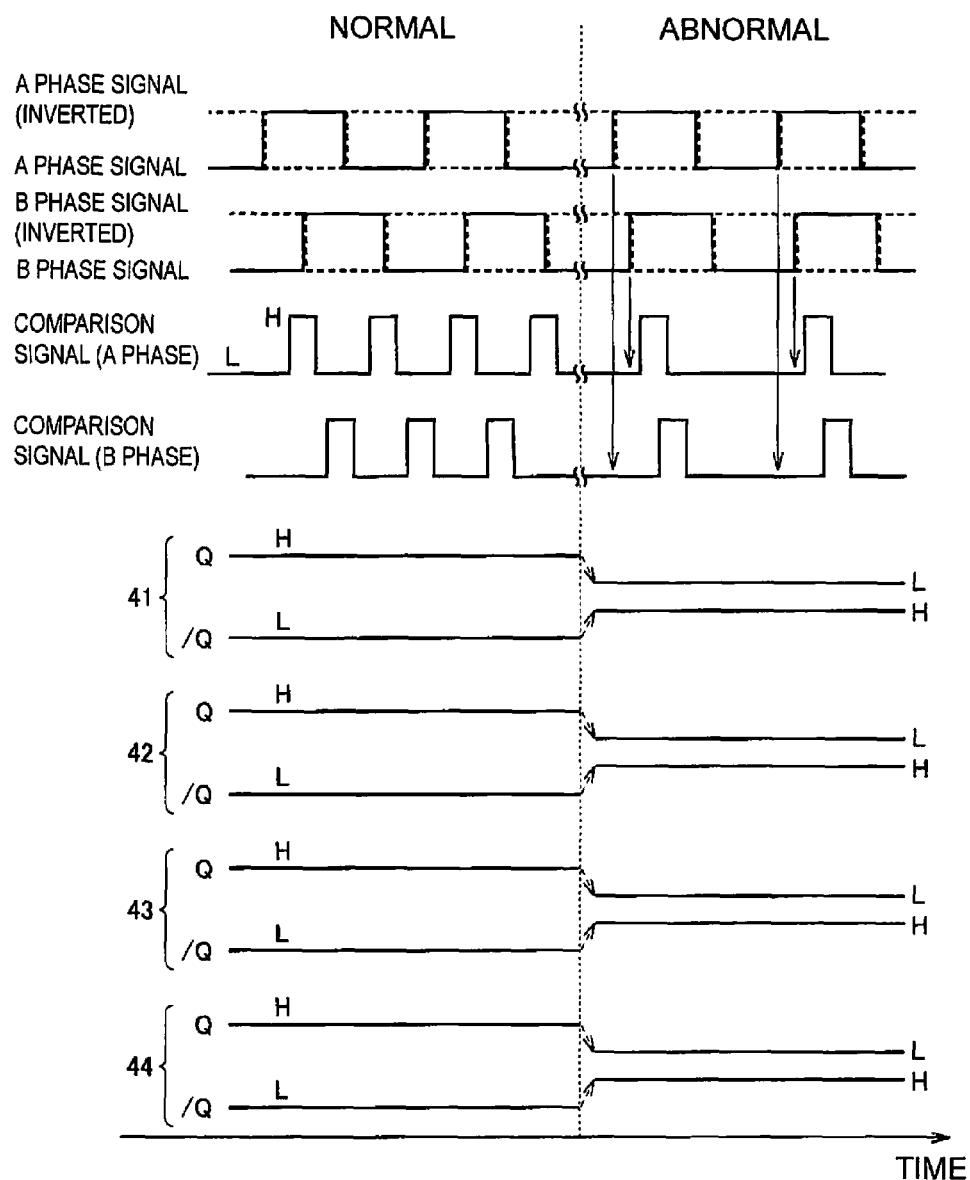
FIG. 11 is a waveform chart for describing an abnormality determining method according to the second embodiment.

FIG. 11 is a waveform chart for describing the abnormality determining method according to the second embodiment. With reference to FIGS. 10 and 11, each of D flip-flops 41 to 44 outputs a value of the input data, which is input at a rising edge of the clock, as output signal Q. Output signal Q of D flip-flop 41 indicates the state of the comparison pulse signal (A phase) at the rise of the B phase signal. Output signal Q of D flip-flop 42 indicates the state of the comparison pulse signal (A phase) at the rise of the inverted signal of the B phase signal (namely, the fall of the B phase signal). Output signal Q of D flip-flop 43 indicates the state of the comparison pulse signal (B phase) at the rise of the inverted signal of the A phase signal (namely, the fall of the A phase signal). Output signal Q of D flip-flop 44 indicates the state of the comparison pulse signal (B phase) at the rise of the A phase signal.

Determining unit 36A receives output signal Q of D flip-flop 41, output signal Q of D flip-flop 42, the output signal /Q of D flip-flop 43, and the output signal /Q of D flip-flop 44. Determining unit 36B receives the output signal /Q of D flip-flop 41, the output signal /Q of D flip-flop 42, output signal Q of D flip-flop 43, and output signal Q of D flip-flop 44.

When the phase difference between the A phase signal and the B phase signal is within a range of 90°±30°, the state of the comparison pulse signal (A phase) at the rise of the B phase signal is the "H" level, and the state of the comparison pulse signal (A phase) at the rise edge of the inverted signal of the B phase signal (namely, the fall of the B phase signal) is also the "H" level. Therefore, the state of each of the output signals Q of D flip-flops 41 and 42 is the "H" level, and the state of the output signals /Q is the "L" level. Besides, the state of each of the output signals Q of D flip-flops 43 and 44 is the "H" level, and the state of the output signals /Q is the "L" level.

When the phase difference between the A phase signal and the B phase signal is outside the range of 90°±30°, the state of the comparison pulse signal (A phase) at the rise of the B phase signal is the "L" level, and the state of the comparison pulse signal (A phase) at the rise of the inverted signal of the B phase signal is also the "L" level. Therefore, the state of each of the output signals Q of D flip-flops 41 and 42 is the "L" level, and the state of the output signals /Q is the "H" level. Similarly, the state of each of the output signals Q of D flip-flops 43 and 44 is the "L" level, and the state of the output signals /Q is the "H" level.

When the states of both the output signals Q output from D flip-flops 41 and 42 are the "H" level, the states of both the output signals /Q output from D flip-flops 43 and 44 are the "L" level, determining unit 36A determines that the phase difference between the A phase signal and the B phase signal is normal (namely, within a range of 90°±30°). Similarly, when the states of both the output signals Q output from D flip-flops 43 and 44 are the "H" level, the states of both the output signals /Q output from D flip-flops 41 and 42 are the "L" level, determining unit 36B determines that the phase difference between the A phase signal and the B phase signal is normal (namely, within the range of 90°±30°).

Each of determining units 36A and 36B determines that the phase difference between the A phase signal and the B phase signal is normal (namely, within the range of 90°±30°) when the combination of the states of the output signals of two flip-flops differs from a predetermined combination. In the present embodiment, the "predetermined combination" means that the combination of the states of the two output signals Q is "H, H", and the combination of the states of the two output signals /Q is "L, L."

When the states of both the output signals Q output from D flip-flops 41 and 42 are the "L" level, or when the states of both the output signals /Q output from D flip-flops 43 and 44 are the "H" level, determining unit 36A determines that the phase difference between the A phase signal and the B phase signal is abnormal. Similarly, when the states of both the output signals Q output from D flip-flops 43 and 44 are the "L" level, or when the states of both the output signals /Q output from D flip-flops 41 and 42 are the "H" level, determining unit 36B determines that the phase difference between the A phase signal and the B phase signal is abnormal.

The flow of the abnormality detecting method according to the second embodiment is basically the same as the flow illustrated in FIG. 9. In the second embodiment, in Step S3, determining units 36A and 36B check the state of the comparison pulse signal, which has been generated using either the A phase signal or the B phase signal, based on the outputs of D flip-flops 41 to 44, at the timings of the rise and the fall of the other signal.

As described above, according to the second embodiment, the abnormalities of the rotary encoder can be detected only with the output signals of the rotary encoder as in the first embodiment. Accordingly, a system for detecting the abnormalities of a rotary encoder can be realized at low cost like in the first embodiment. Moreover, because it is possible to accurately detect the abnormalities of a rotary encoder, the system illustrated in FIG. 1 can be built as a safe system.

In each of above-described embodiments, the frequency multiplying circuit generates a signal with a frequency that is 3 times the frequency of the original signal. However, the multiple of the frequency is not limited to 3 but other multiples are acceptable as long as the multiples are (2n+1) times the frequency of the original signal (where n is an integer equal to or greater than 1). The greater the integer n, the narrower the settable tolerance range of the phase difference between the A phase signal and the B phase signal.

Figure 12:
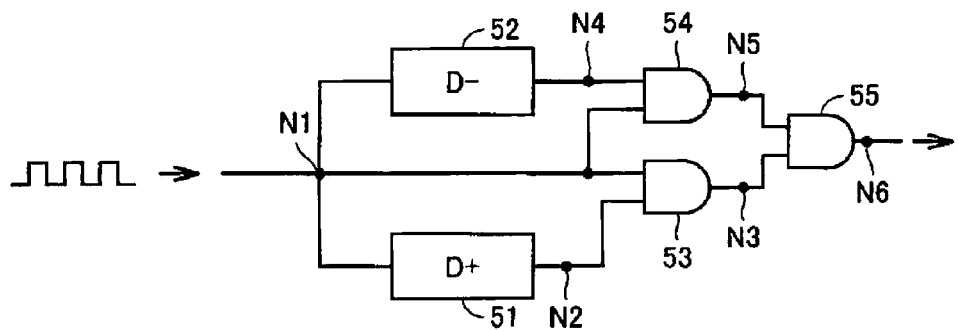
FIG. 12 is a diagram illustrating an example of another configuration of a pulse generating unit.

In addition, the pulse generating unit is not limited to a configuration that includes a frequency multiplying circuit and an XOR circuit. The pulse generating unit may have other configurations as long as a portion corresponding to a specific phase range can be extracted from the original pulse signal. FIG. 12 is a diagram illustrating an example of another configuration of the pulse generating unit. With reference to FIG. 12, the pulse generating unit includes delay circuits 51 and 52 and AND circuits 53 to 55.

Figure 13:
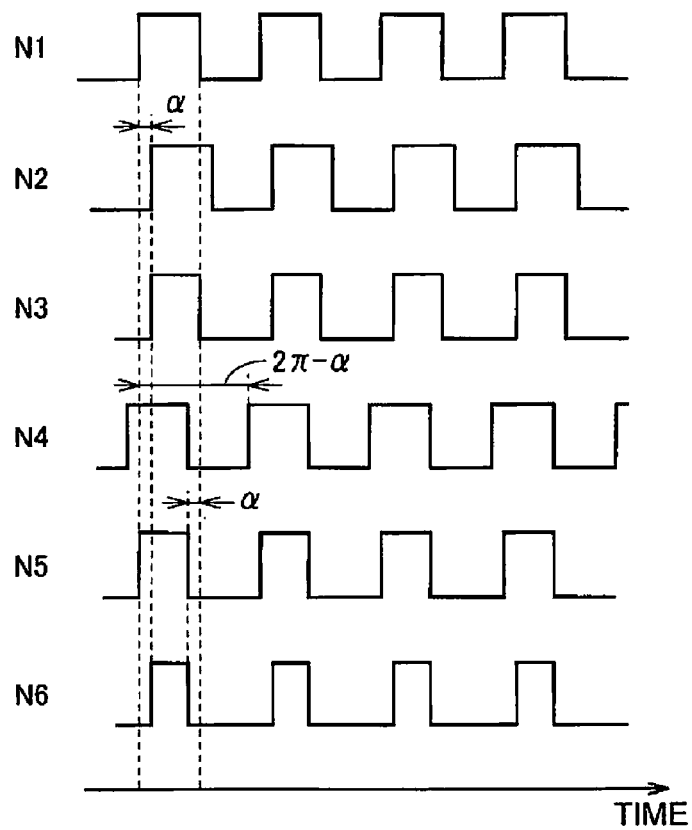
FIG. 13 is a waveform chart for describing operation of the pulse generating unit illustrated in FIG. 12.

FIG. 13 is a waveform chart for describing operation of the pulse generating unit illustrated in FIG. 12. With reference to FIGS. 12 and 13, delay circuit 51 delays a signal that has been input to node N1 by a phase α (0<α<π/2) and outputs the delayed signal to node N2. The time corresponding to the phase α varies depending on the frequency of a signal.

AND circuit 53 calculates the logical product of the signal that has been input to node N1, and the signal that has been output to node N2. The signal that has been output to node N3 is delayed so that this signal rises behind the signal that has been input to node N1 by a time width corresponding to the phase α. The signal then falls in synchronization with the signal that has been input to node N1.

Delay circuit 52 delays the signal that has been input to node N1 by a phase (2π−α) and outputs the delayed signal to node N4. AND circuit 54 calculates the logical product of the signal that has been input to node N1, and the signal that has been output to node N4. A signal that has been output to node N5 rises in synchronization with the signal that has been input to node N1 and falls ahead of the signal that has been input to node N1 by a time width corresponding to the phase α.

AND circuit 55 calculates the logical product of the signal that has been input to node N3, and the signal that has been output to node N5. A signal that has been output to node N6 rises behind the signal that has been input to node N1 by a time width corresponding to the phase α and falls ahead of the signal by a time width corresponding to the phase α. Therefore, the center of the pulse of the signal that has been output to node N6 matches the center of the pulse of the signal that has been input to node N1, but the pulse width is narrowed. Therefore, according to the configuration illustrated in FIG. 12, a portion near the center of the original pulse (i.e., portion corresponding to a phase range containing 90°) can be extracted from the pulse signal that has been input to node N1.

In addition, the abnormalities of a rotary encoder may be determined by extracting a portion corresponding to a certain specific phase range from a first pulse included in a first pulse signal to generate a comparison pulse signal, and by determining a state of the comparison pulse signal at a specific timing of the second pulse. Therefore, it is not necessary to limit the "specific phase range" to a range including normal values of the phase difference. Similarly, the "specific timing of a second pulse included in a second pulse signal" is not limited to the rise or fall of a second pulse.

In this way, embodiments provides monitoring devices and a monitoring methods for monitoring an encoder that can detect abnormalities of the encoder only with output signals of one TTL rotary encoder.

In all points, the embodiments disclosed herein are provided, only by way of examples, and should not be limitedly construed. The scope of the claimed invention is not defined by the description of the above-described embodiments but is defined by the following claims. All changes within the scope of the claims and within the meaning and scope equivalent to the scope of the claims may fall within the scope of the invention.

What is claimed is:

1. A monitoring device for a rotary encoder electronically connectable to the monitoring device comprising:
   a pulse generating unit that generates a comparison pulse signal by extracting a portion corresponding to a specific phase range from a first pulse included in a first pulse signal output from the rotary encoder that detects rotation of a rotating body and outputs the first pulse signal and a second pulse signal, the first pulse signal and the second pulse signal having a phase difference from each other; and
   a determining unit that determines an abnormality of the rotary encoder, based on a state of a pulse of the comparison pulse signal at a specific timing of a second pulse included in the second pulse signal,
   wherein the determining unit determines that the rotary encoder is abnormal when the state of a pulse of the comparison pulse signal differs from a predetermined state when at least one of a rise and a fall of the second pulse occurs, and
   wherein the pulse generating unit includes a frequency multiplying unit that generates a third pulse signal having a frequency of (2n+1) times a frequency of the first pulse signal, wherein n is an integer equal to or greater than 1, and an exclusive OR logic generating unit that generates the comparison signal by generating an exclusive OR logic of the third pulse signal and the first pulse signal.

2. The monitoring device for a rotary encoder according to claim 1, wherein n is 1.

3. A monitoring method for a rotary encoder detecting rotation of a rotating body and outputting a first pulse signal and a second pulse signal, the first pulse signal and the second pulse signal having a phase difference from each other, the monitoring method comprising: generating a comparison pulse signal by extracting a portion corresponding to a specific phase range from a first pulse included in the first pulse signal; and determining an abnormality of the rotary encoder, based on a state of a pulse of the comparison pulse signal at a specific timing of a second pulse included in the second pulse signal,
   wherein determining the abnormality of the rotary encoder comprises detecting a difference in the state of a pulse of the comparison pulse signal from a predetermined state during at least one of a rise and a fall of the second pulse, and
   wherein generating the comparison pulse signal comprises: generating a third pulse signal having a frequency of (2n+1) times a frequency of the first pulse signal wherein n is an integer equal to or greater than 1, and generating the comparison pulse signal by generating an exclusive OR logic of the third pulse signal and the first pulse signal.

4. The monitoring method for a rotary encoder according to claim 3, wherein n is 1.

* * * * *